(12) United States Patent
Hirose et al.

(10) Patent No.: US 9,048,837 B2
(45) Date of Patent: Jun. 2, 2015

(54) CASCODE TRANSISTOR AND METHOD OF CONTROLLING CASCODE TRANSISTOR

(71) Applicant: FUJITSU Limited, Kawasaki-shi, Kanagawa (JP)

(72) Inventors: Tatsuya Hirose, Yokohama (JP); Kazukiyo Joshin, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/479,717

(22) Filed: Sep. 8, 2014

(65) Prior Publication Data

US 2015/0084685 A1  Mar. 26, 2015

(30) Foreign Application Priority Data

Sep. 20, 2013  (JP) ................................. 2013-195286

(51) Int. Cl.
*H03K 17/16* (2006.01)
*H03K 17/30* (2006.01)
*H03K 17/567* (2006.01)

(52) U.S. Cl.
CPC ............ *H03K 17/302* (2013.01); *H03K 17/567* (2013.01); *H03K 17/162* (2013.01); *H03K 2217/0036* (2013.01); *H03K 2217/0054* (2013.01)

(58) Field of Classification Search
None
See application file for complete search history.

(56) References Cited

U.S. PATENT DOCUMENTS

| | | | |
|---|---|---|---|
| 7,902,809 B2 * | 3/2011 | Briere et al. ................... | 323/351 |
| 8,847,235 B2 * | 9/2014 | Rose ............................... | 257/76 |
| 2008/0174184 A1 * | 7/2008 | Arpilliere et al. ............. | 307/125 |
| 2009/0096526 A1 * | 4/2009 | Ishizuka ........................ | 330/277 |
| 2011/0199148 A1 | 8/2011 | Iwamura | |
| 2012/0262220 A1 | 10/2012 | Springett | |
| 2013/0187627 A1 * | 7/2013 | Imada et al. .................. | 323/311 |
| 2014/0028375 A1 | 1/2014 | Komiya | |

FOREIGN PATENT DOCUMENTS

| | | | |
|---|---|---|---|
| JP | H06-169246 A1 | 6/1994 | |
| JP | 2011-166673 A1 | 8/2011 | |
| JP | 2012-227919 A1 | 11/2012 | |

* cited by examiner

*Primary Examiner* — Cassandra Cox
(74) *Attorney, Agent, or Firm* — Kratz, Quintos & Hanson, LLP

(57) ABSTRACT

A cascode transistor includes: a first switch; a second switch that has a withstand voltage higher than that of the first switch and is cascade coupled to a drain of the first switch; and a circuit in which a third switch and a capacitor are coupled in series with each other and that is provided between a connection node and a source of the first switch, the connection node being a node at which the first switch and the second switch are coupled to each other.

12 Claims, 13 Drawing Sheets

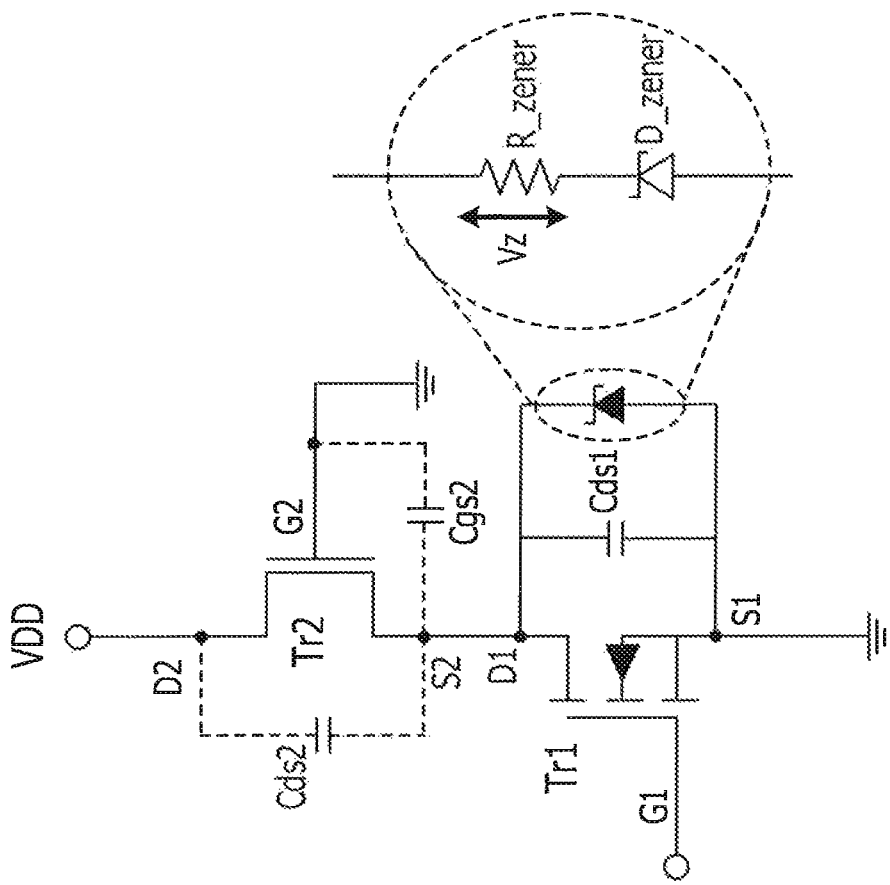
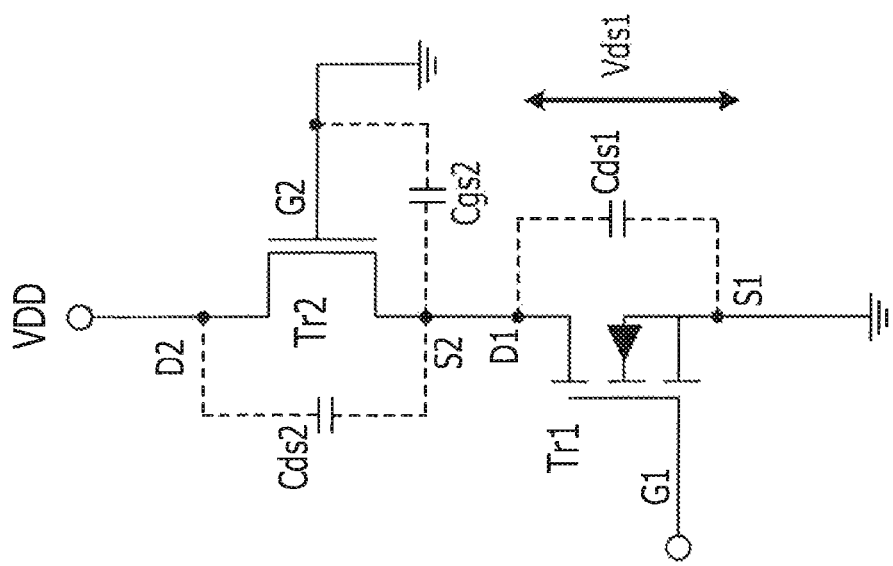

FIG. 4A
FIG. 4B
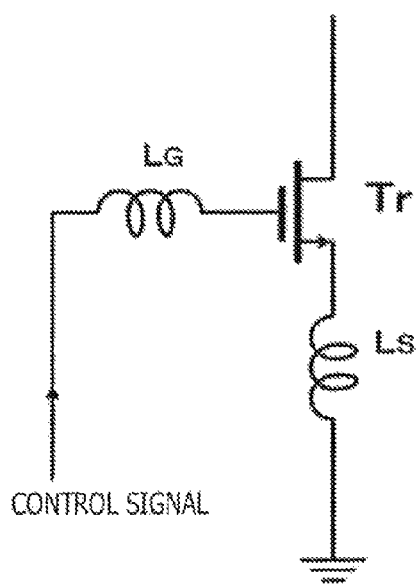
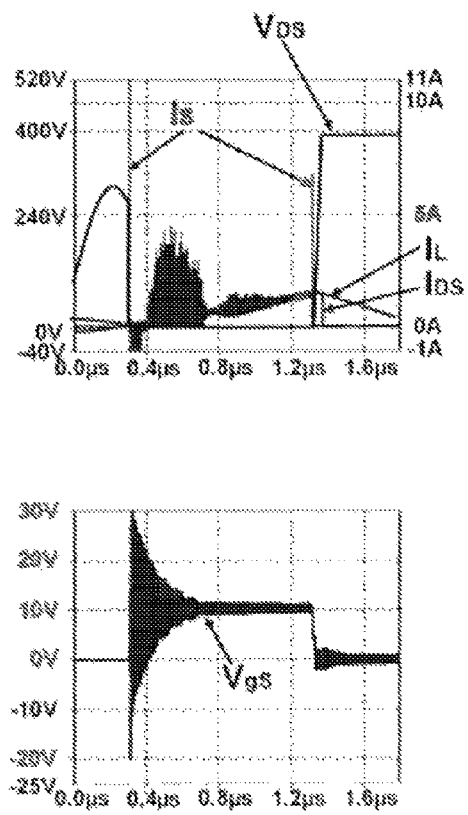

FIG. 7A
Cadd=0nF
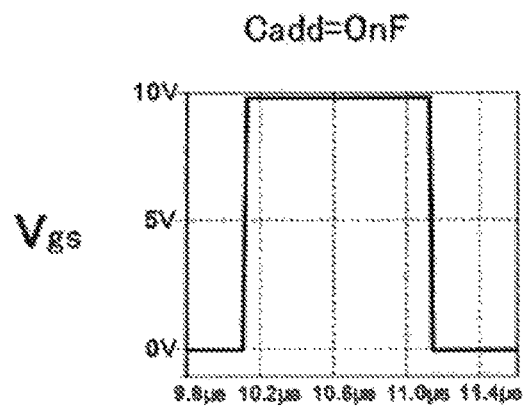
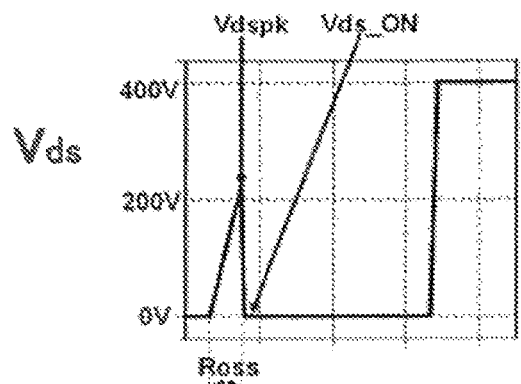
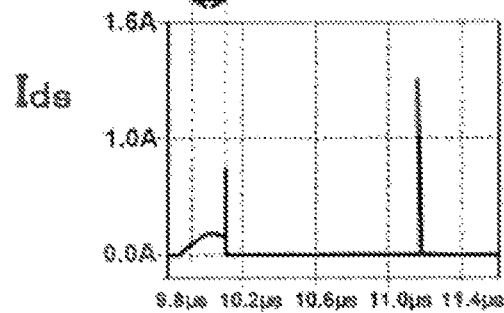
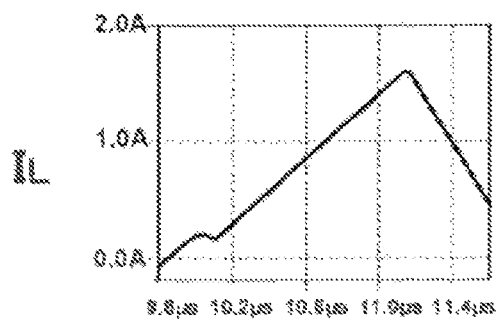
FIG. 7B
Cadd=2nF
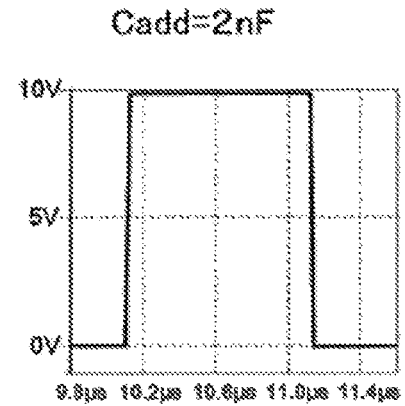
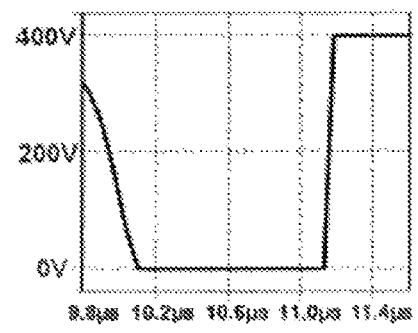
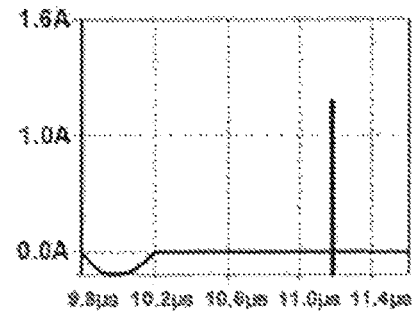
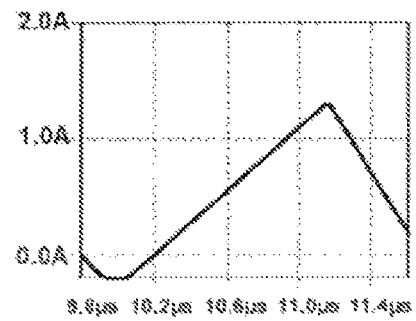

FIG. 8A
FIG. 8B
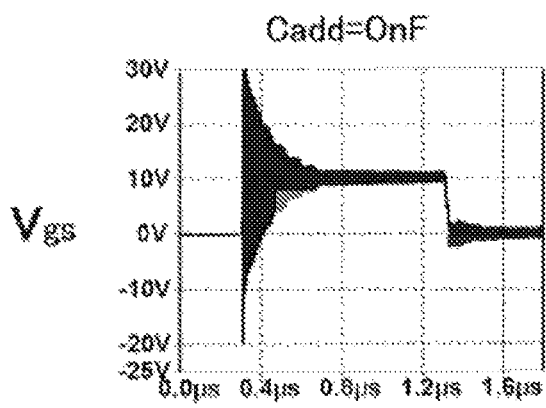
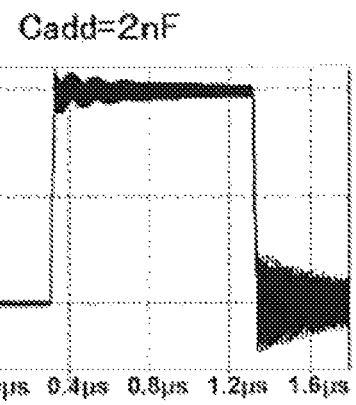
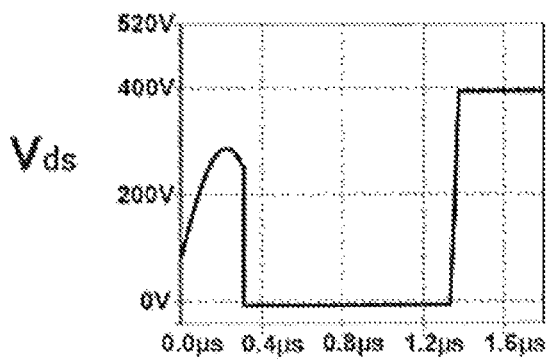
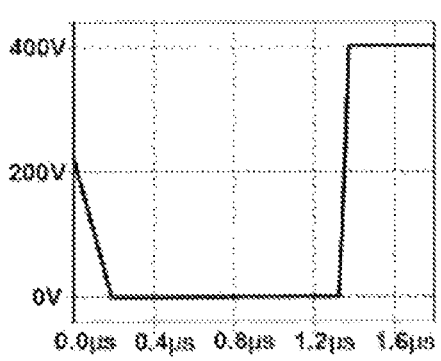
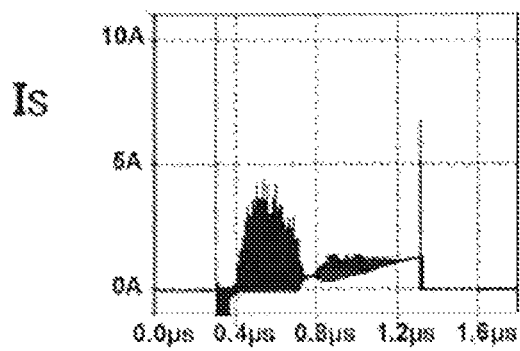
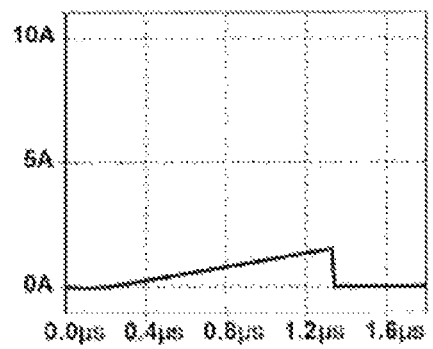
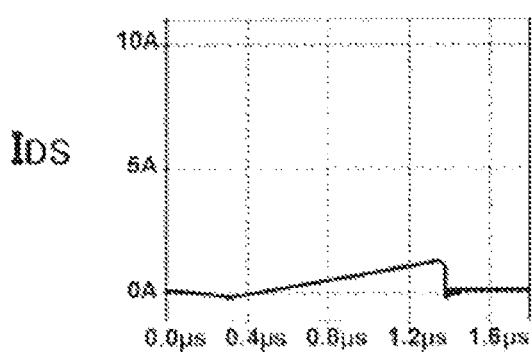
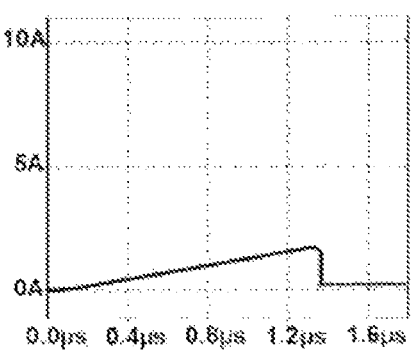

ically pointed out in the claims.
CASCODE TRANSISTOR AND METHOD OF CONTROLLING CASCODE TRANSISTOR

CROSS-REFERENCE TO RELATED APPLICATION

This application is based upon and claims the benefit of priority of the prior Japanese Patent Application No. 2013-195286 filed on Sep. 20, 2013, the entire contents of which are incorporated herein by reference.

FIELD

The embodiments discussed herein are related to a cascode transistor in which a normally-on-type transistor and a normally-off-type transistor are cascode connected with each other and relates to a method of controlling a cascode transistor.

BACKGROUND

In recent years, development of electronic devices in which GaN layers and AlGaN layers are sequentially formed on a substrate composed of for example sapphire, SiC, gallium nitride (GaN) or Si and in which the GaN layers are employed as electron travelling layers (compound semiconductor devices) has been active.

The bandgap of GaN is 3.4 eV, which is large compared with the bandgap of 1.1 eV of Si and the bandgap of 1.4 eV of GaAs. Consequently, operation at a high withstand voltage is anticipated in such compound semiconductor devices.

One example of such a compound semiconductor device is a GaN-based high-electron-mobility transistor (HEMT). Hereafter, a GaN-based high-electron-mobility transistor will be referred to as a GaN-HEMT. An HEMT is a field-effect transistor in which a high-mobility two-dimensional electron gas (2DEG) induced in a semiconductor heterojunction is employed as a channel.

When a GaN-HEMT is used as a power supply inverter switch, it is possible to achieve both a reduction in on resistance and an improvement in withstand voltage. In addition, compared with Si-based transistors, it is possible to achieve reduced power consumption during standby and improved operation frequency.

Consequently, it is possible to decrease the switching loss and the power consumption of the inverter. In addition, for transistors of equivalent performance, it is possible to make a GaN-HEMT smaller than a Si-based transistor.

However, a silicon MOS-FET of the related art is a normally off type (enhancement mode) of transistor that is off in a state in which a voltage is not being applied to its gate, whereas a GaN-HEMT is usually a normally on type (depression mode) of transistor which is on in a state in which a voltage is not being applied to its gate.

Consequently, there is a cascode transistor in which with an enhancement mode FET is used in combination with a depression mode GaN-HEMT so as to operate in an enhancement mode in order to switch the depression mode GaN-HEMT.

The following are reference documents:
[Document 1] Japanese Laid-open Patent Publication No. 2011-166673 and
[Document 2] US Patent No. 2012/0262220A1.

SUMMARY

According to an aspect of the invention, a cascode transistor includes: a first switch; a second switch that has a withstand voltage higher than that of the first switch and is cascode coupled to a drain of the first switch; and a circuit in which a third switch and a capacitor are coupled in series with each other and that is provided between a connection node and a source of the first switch, the connection node being a node at which the first switch and the second switch are coupled to each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 1A and 1B are circuit diagrams of cascode transistors;

FIGS. 4A and 4B are diagrams for explaining a parasitic inductance;

FIGS. 7A and 7B are diagrams for explaining the effect of the cascode transistor of the first embodiment;

FIGS. 8A and 8B are diagrams for explaining the effect of the cascode transistor of the first embodiment;

DESCRIPTION OF EMBODIMENTS

Figure 2:
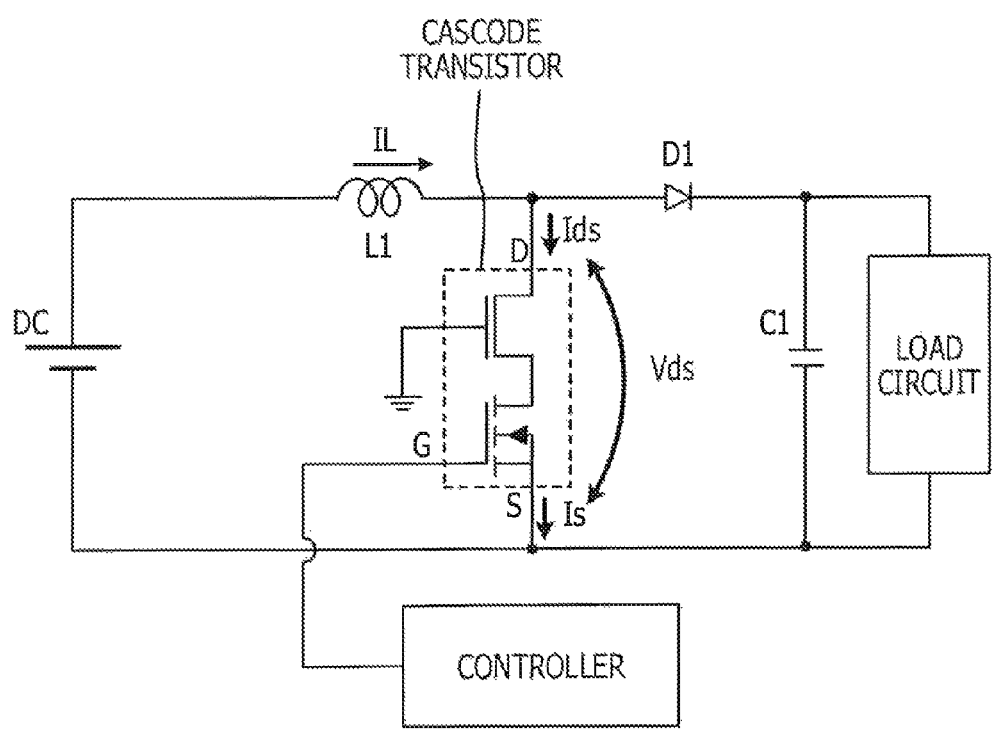
FIG. 2 is a circuit diagram of booster circuit employing a cascode transistor.

First, an example of a cascode transistor is illustrated in FIG. 1A. The cascode transistor is a circuit in which a normally-off-type first switching element Tr1 and a normally-on-type second switching element Tr2 are connected in series with each other, a source S2 of the second switching element Tr2 being connected to a drain D1 of the first switching element Tr1. A gate G2 of the second switching element Tr2 and a source Si of the first switching element Tr1 are grounded. The normally-off-type first switching element Tr1 is for example a generally available silicon-based n-type MOS-FET. The normally-on-type second switching element Tr2 is for example a GaN-HEMT.

Next, operation of the cascode transistor will be described. First, when the first switching element Tr1 is turned off, the resistance of the first switching element Tr1 increases and the drain voltage of the first switching element Tr1 increases due to the resistance of the first switching element Tr1 being balanced by the resistance of the second switching element Tr2, which is still on. Then, the gate voltage of the second switching element Tr2 is 0 V and therefore the source voltage of the second switching element Tr2 becomes higher than the gate voltage. Here, if the threshold at which the second switching element Tr2 is turned off and on is −5 V for example, the second switching element Tr2 is turned off at the instant at which the source voltage of the second switching element Tr2 becomes 5 V.

A drain D2 of the second switching element Tr2 functions as a drain of the cascode transistor and the source S1 of the first switching element Tr1 functions as a source of the cascode transistor. Similarly, a gate G1 of the first switching element Tr1 functions as a gate of the cascode transistor.

Next, a problem of the cascode transistor will be described. When the cascode transistor is switched at a frequency of several hundred KHz or more, the drain-source voltage distribution is determined by the magnitudes of drain-source capacitances of the individual transistors. A drain-source voltage Vds1 of the first switching element Tr1 is determined by a drain-source capacitance Cds2 of the second switching element Tr2.

$$Vds1 = VDD \times Cds2/(Cds1 + Cgs2 + Cds2) \quad \text{(Equation 1)}$$

Cds1: drain-source capacitance of first switching element Tr1

Cgs2: gate-source capacitance of second switching element Tr2

The second switching element Tr2 is for example a GaN-HEMT and has a large capacitance and therefore the drain-source voltage Vds1 of the first switching element Tr1 is larger than the drain-source voltage of the second switching element Tr2. The second switching element Tr2 has a large withstand voltage but a larger voltage is applied to the first switching element Tr1 at the time of a switching operation.

The first switching element Tr1 is for example a high-speed Si-MOS and has a low input capacitance and a high gm and therefore has a low withstand voltage at a short gate length, and as a result a problem of reliability in terms of degradation or lifetime reduction occurs due to the drain-source voltage Vds1 of the first switching element Tr1 exceeding the source-drain withstand voltage of the first switching element Tr1.

Consequently, if an attempt is made to also use a transistor that has a large withstand voltage as the first switching element Tr1, the merit of small input capacitance and high speed operation of the cascode transistor configuration is lost.

In addition, as illustrated in FIG. 1B, there is a configuration in which a zener diode is connected in parallel between the drain and the source of the first switching element Tr1.

In this configuration illustrated in FIG. 1B, a zener diode D_zener is connected between the source and the drain of the first switching element Tr1 such that the source-drain voltage Vds1 of the first switching element Tr1 does not exceed the withstand voltage of the first switching element Tr1. However, since a large internal resistance R_zener exists in series with an actual zener diode, the source-drain voltage Vds1 of the first switching element Tr1 is not fixed. Thus, the characteristics of the cascode transistor are rate limited by the performance of the zener diode and therefore the maximum performance of the cascode transistor may not be extracted.

The inventors performed investigations regarding the loss of a circuit that employs a cascode transistor.

Figure 3:
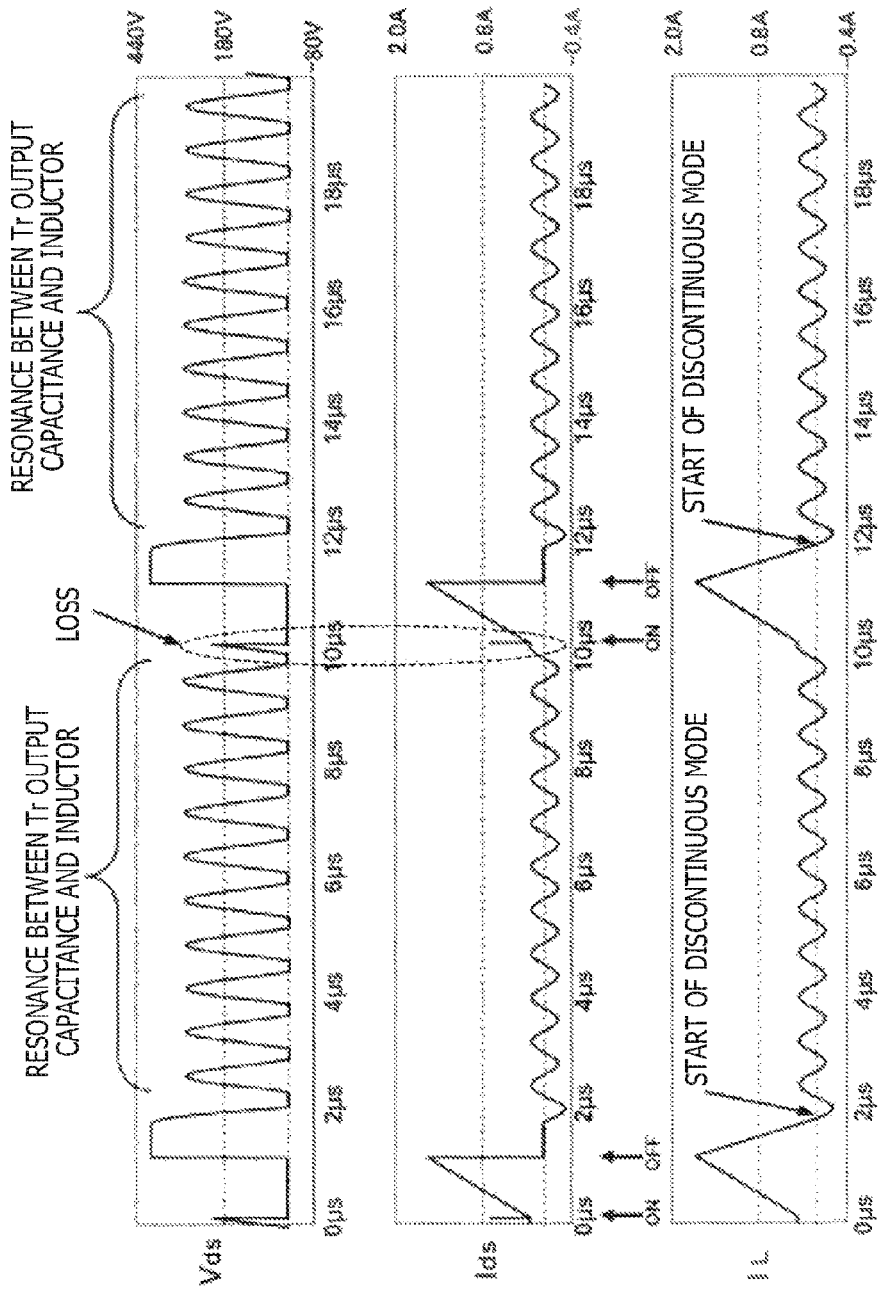
FIG. 3 is a diagram for explaining operation of a booster circuit.

FIG. 2 illustrates an example of a booster circuit that employs a cascode transistor. FIG. 3 illustrates operation waveforms in the booster circuit of FIG. 2 and places where switching loss occurs.

When output power is small, the booster circuit generally operates in a current discontinuous mode. Referring to FIG. 3, the cascode transistor is turned on, an inductor current IL and a transistor current Ids flow and energy is stored in an inductor L1. Then, the cascode transistor is turned off and the energy is discharged to the output side in the form of a current. The term "current discontinuous mode" refers to a state in which the current disappears in the off period of the cascode transistor.

In the period in which the current disappears, series resonance occurs between the inductor L1, which has the role of storing energy, and an equivalent capacitance seen from an output terminal of the cascode transistor, and consequently the voltage at the output terminal of the cascode transistor oscillates. The frequency of this oscillation is a resonant frequency determined by the inductor L1 and the equivalent capacitance seen from the output terminal of the cascode transistor. Now, when the cascode transistor is turned on in the resonant state, an initial value of the voltage at the output terminal of the cascode transistor at that time is dependent on the timing at which the cascode transistor is turned on.

As illustrated in FIG. 3, in the current discontinuous mode, switching loss occurs due to overlapping of the source-drain voltage Vds and the drain current Ids. When the gate voltage Vgs is turned on in a state in which the source-drain voltage Vds is large, overlapping of the source-drain voltage Vds and the drain current Ids is large and the switching loss is large. In the related art, in the discontinuous mode, it has not been possible to control the switching loss by making the size of the source-drain voltage Vds appropriately match the timing with which the gate voltage Vgs is switched.

In addition, the inventors investigated ringing or oscillation that occurs in a circuit employing a cascode transistor.

Referring to FIG. 4A, an actual transistor is mounted on for example a printed board as a device sealed in a molded package or sealed in a metal package. In particular, a wiring line that is connected to a source terminal often acts as an inductance, and parasitic inductances LG and LS that exist in the package and on the circuit board are connected to the terminals of the transistor.

Sometimes resonance is generated between such a parasitic inductance and a gate-source capacitance of the transistor being used and as a result of this the transistor may give rise to ringing or oscillation. If the rise time (tr) and the fall time (tf) of the transistor are short and the mutual conductance (ΔIds/ΔVgs=gm) is large, the resonance is easily amplified and ringing or oscillation is easily caused. Consequently, not only does the switching operation of the transistor become unstable, there is also a risk of inviting an increase in the switching loss.

FIG. 4B illustrates waveforms for a time when ringing or oscillation is generated. In a method of controlling ringing and oscillation of the related art, a large resistance is inserted in series with a gate terminal to remove a current flowing from an output terminal and further a snubber circuit is provided between the output terminal and ground to cause loss, whereby ringing and oscillation are suppressed. However, in this method, the rise time of the gate voltage Vgs is large and therefore the transition time at the times of turning on and turning off of the source-drain voltage Vds and the drain current Ids is large and the switching loss is consequently large.

Regarding a first problem in which a voltage equal to or greater than the withstand voltage is applied between the drain and source of the first switching element Tr1, a second problem in which switching loss in a current discontinuous mode in a booster circuit is large, and a third problem in which the switching operation of a transistor is unstable due to the effect of a parasitic inductance, the inventors focused upon the voltage at a midpoint of the cascode connection and proposed the following embodiments.

Preferred embodiments of the technology of the present disclosure will be described in detail below with reference to the drawings.

Figure 5:
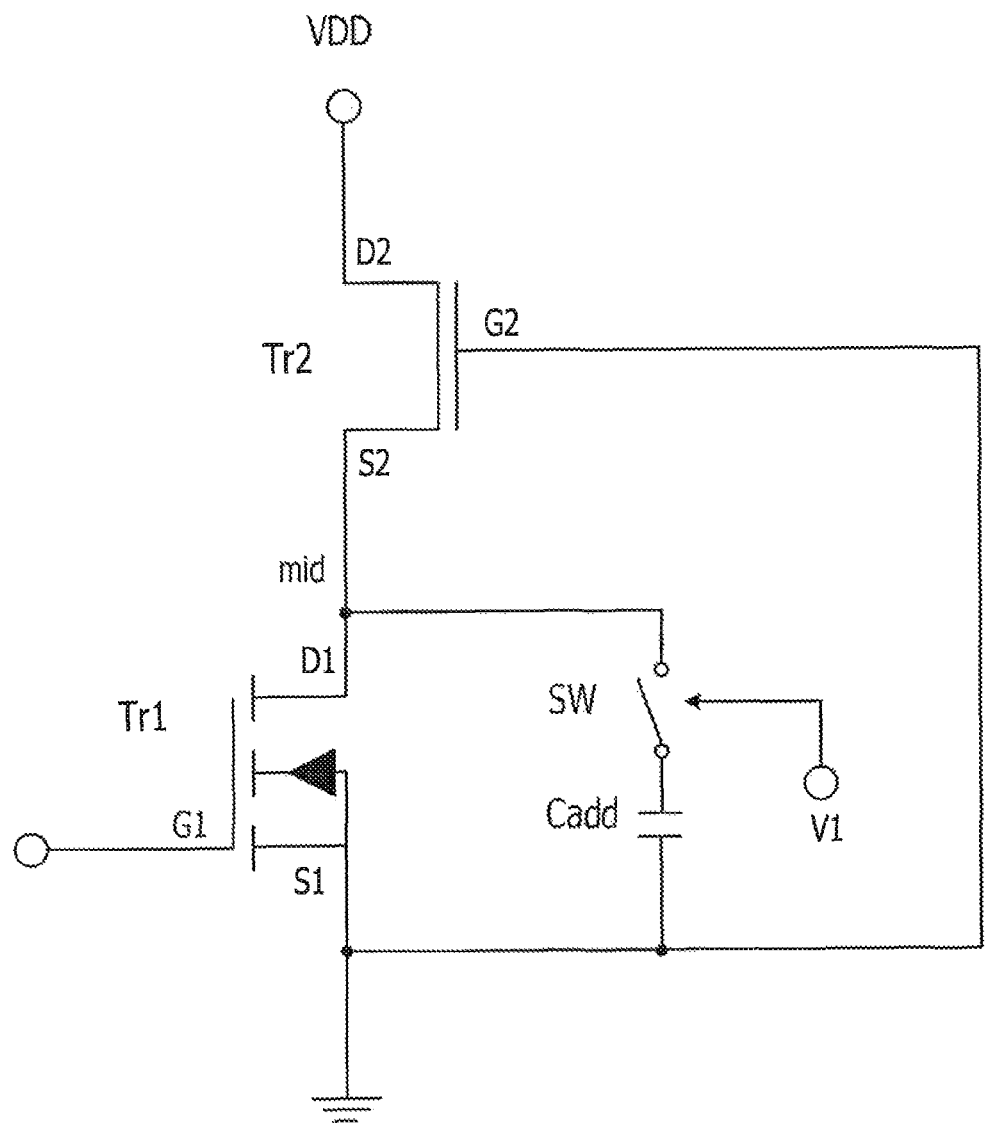
FIG. 5 is a circuit diagram of a cascode transistor of a first embodiment.

FIG. 5 is a diagram illustrating a cascode transistor of a first embodiment in which the disclosed technology is applied. In FIG. 5, constituent elements that are the same as or equivalent to those of the cascode transistor illustrated in FIGS. 1A and 1B are denoted by the same symbols and description thereof is omitted.

A cascade transistor of this embodiment is a circuit in which a normally-off-type first switching element Tr1 and a normally-on-type second switching element Tr2 are connected in series with each other, a source S2 of the second switching element Tr2 being connected to a drain D1 of the first switching element Tr1. A gate G2 of the second switching element Tr2 and a source S1 of the first switching element Tr1 are grounded. The normally-off-type first switching element Tr1 is for example is a generally available silicon-based n-type MOS-FET. The normally-on-type second switching element Tr2 is for example a GaN-HEMT.

In addition, a circuit in which a switch SW and a capacitor Cadd are connected in series with each other is connected in parallel between a node mid, at which the source S2 of the second switching element Tr2 and the drain D1 of the first switching element Tr1 are connected to each other, and the source S1 of the first switching element Tr1.

A drain D2 of the second switching element Tr2 functions as a drain of the cascade transistor and the source Si of the first switching element Tr1 functions as a source of the cascade transistor. Similarly, a gate G1 of the first switching element Tr1 functions as a gate of the cascade transistor.

The switch SW has an external terminal V1 through which switching of the switch SW may be controlled from the outside and the switch SW is turned on and off by using a signal input to the external terminal V1. The switch SW for example is a generally available transistor such as a silicon-based n-type MOS-FET or a GaN-HEMT.

Regarding operation of the switch SW, the switch SW is switched on immediately before a gate signal of the cascade transistor becomes off and then the capacitor Cadd is connected to the node mid. By connecting the capacitor Cadd to the node mid, the voltage at the node mid is stabilized and therefore it is possible to avoid application of a voltage that exceeds the withstand voltage of the first switching element Tr1 between the drain and the source of the first switching element Tr1.

In addition, the switch SW is switched off immediately before the gate signal of the cascade transistor becomes on and the capacitor Cadd is isolated from the node mid, whereby the time taken in charging at the time of turn on may be shortened.

If the capacitor Cadd were simply connected to the node mid without the switch SW, only one of the action of a simple filter and the action of stabilizing the voltage at the time of switching would be obtained. However, both actions can be obtained by connecting the switch SW and controlling the switch SW from the outside.

Next, the effect on the above-described first problem will be described.

Figure 6A:
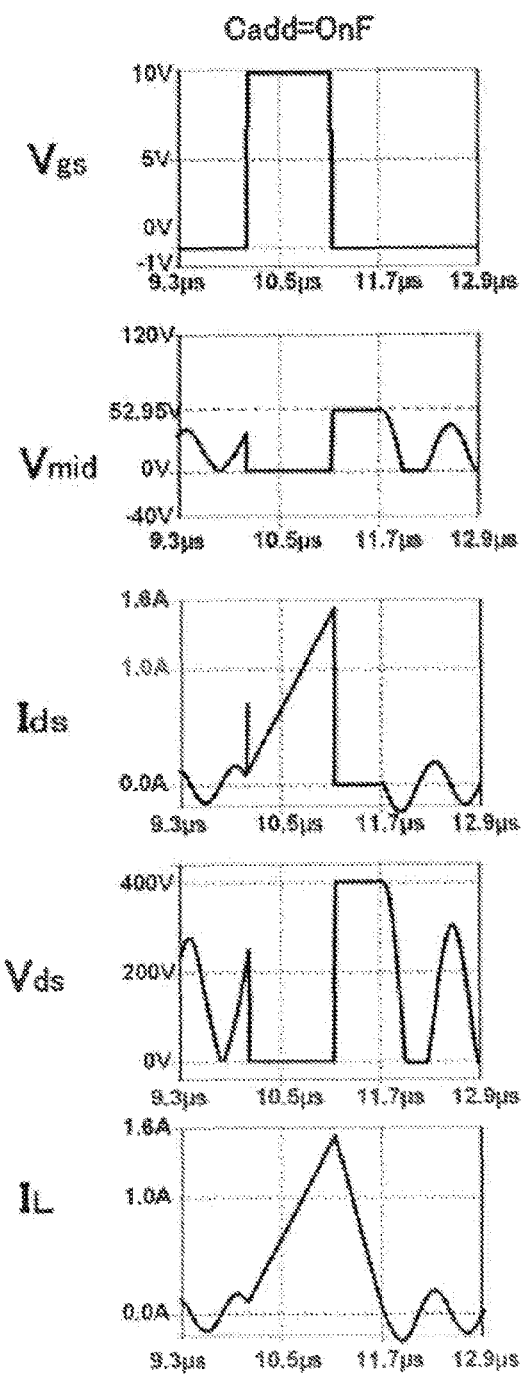
FIGS. 6A and 6B are diagrams for explaining the effect of the cascode transistor of the first embodiment.
Figure 6B:
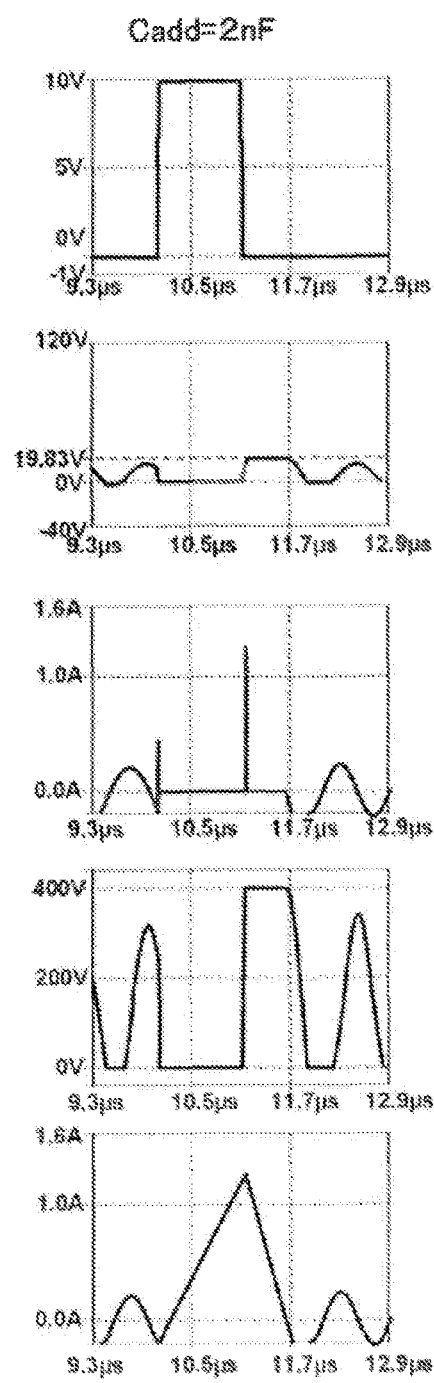

FIGS. 6A and 6B illustrate simulated waveforms for a case where the cascade transistor of the booster circuit illustrated in FIG. 2 is replaced with the cascade transistor of this embodiment.

FIG. 6A on the left-hand side illustrates simulation waveforms for a case where the capacitance of the capacitor Cadd is 0 nF, that is, SW is in an off state, which is a condition equivalent to the configuration of the related art. FIG. 6B on the right-hand side illustrates simulation waveforms for the case where the capacitance of the capacitor Cadd is 2 nF and SW is in an on state.

In FIG. 6A and FIG. 6B, from the top, a gate voltage Vgs of the cascade transistor, a voltage Vmid at the node mid at which the source S2 of the second switching element Tr2 and the drain D1 of the first switching element Tr1 are connected to each other, a drain-source current Ids of the cascade transistor, a drain voltage Vds of the cascade transistor and an inductor current IL are illustrated.

The drain-source withstand voltage of the first switching element Tr1 is 20 V and the drain-source withstand voltage of the second switching element Tr2 is 600 V.

As simulation conditions, the switching frequency of an input signal of the first switching element Tr1 of the cascade transistor is set to be 100 kHz and the drain voltage VDD is set to be 400 V. The capacitances between the terminals are Cds1=500 pF, Cds2=150 pF and Cgs2=500 pF.

First, using a simple calculation, the voltage when each of the transistors of the cascade transistor is off will be provisionally calculated.

Assuming that the voltage when each of the transistors of the cascade transistor is off is determined by the capacitances between the terminals, a drain-source voltage Vds2_OFF of the second switching element Tr2 when the second switching element Tr2 is off is obtained from $$Vds2\_OFF = VDD \times Zds2\_OFF/(Zds1\_OFF + Zds2\_OFF)$$

$$= VDD \times (Cds1 + Cgs2)/(Cds2 + Cds1 + Cgs2)$$

$$= 400 \times (500p + 500p)/(150p + 500p + 500p)$$

$$= 347.8261\ V \qquad \text{(Equation 2)}$$

and a drain-source voltage Vds1_OFF of the first switching element Tr1 when the first switching element Tr1 is off is obtained from $$Vds1\_OFF = VDD \times Zds1\_OFF/(Zds1\_OFF + Zds2\_OFF)$$

$$= VDD \times Cds2/(Cds2 + Cds1 + Cgs2)$$

$$= 400 \times 150p/(150p + 500p + 500p)$$

$$= 52.1739\ V \qquad \text{(Equation 3).}$$

Here, Zds1_OFF is a drain-source impedance of the first switching element Tr1 when the first switching element Tr1 is off and Zds2_OFF is a drain-source impedance of the second switching element Tr2 when the second switching element Tr2 is off.

In the simulation results illustrated in FIG. 6A, the voltage Vmid at the node mid at a time when the gate is off is 52.95 V and substantially matches the above calculation. At this time, a voltage that greatly exceeds 20 V which is the drain withstand voltage of the first switching element Tr1 is applied to the first switching element Tr1.

The drain-source voltage Vds2_OFF of the second switching element Tr2 when the second switching element Tr2 is off in the case where the capacitor Cadd of 2 nF is added is obtained from $$Vds2\_OFF = VDD \times Zds2\_OFF/(Zds1\_OFF + Zds2\_OFF)$$

$$= VDD \times (Cds1 + Cgs2)/(Cds2 + Cds1 + Cgs2 + Cadd)$$

$$= 400 \times (500p + 500p + 2n)/(150p + 500p + 500p + 2n)$$

$$= 350.9524\ V \qquad \text{(Equation 4)}$$

and a drain-source voltage Vds1_OFF of the first switching element Tr1 when the first switching element Tr1 is off is obtained from $$Vds1\_OFF = VDD \times Zds1\_OFF/(Zds1\_OFF + Zds2\_OFF)$$

$$= VDD \times Cds2/(Cds2 + Cds1 + Cgs2 + Cadd)$$

$$= 400 \times 150p/(150p + 500p + 500p + 2n)$$

$$= 19.0476\ V \qquad \text{(Equation 5)}.$$

In the simulation results illustrated in FIG. 6B, the voltage Vmid at the node mid at a time when the gate is off is 19.83 V and substantially matches the above calculation. At this time, a voltage that exceeds 20 V which is the drain withstand voltage of the first switching element Tr1 is not applied to the first switching element Tr1. Therefore, degradation and lifetime reduction of the first switching element Tr1 may be avoided.

Next, FIGS. 7A and 7B will be used to explain the effect on the above-described second problem.

FIG. 7A on the left-hand side illustrates simulation waveforms for a case where the capacitance of the capacitor Cadd is 0 nF, that is, SW is in an off state, which is a condition equivalent to the configuration of the related art. FIG. 7B on the right-hand side illustrates simulation waveforms for the case where the capacitance of the capacitor Cadd=2 nF and SW is in an on state.

In FIG. 7A and FIG. 7B, from the top, a gate voltage Vgs of the cascade transistor, a drain voltage Vds of the cascade transistor, a drain current Ids of the cascade transistor and an inductor current IL are illustrated.

Referring to FIG. 7A, assuming that the gate of the cascade transistor is turned on when the output drain voltage Vds of the cascade transistor which is in a resonant state has reached a peak, the drain voltage Vds changes from Vdspk to the on voltage Vds_ON of the cascade transistor which is normally a few tens of mV in a switching transition period and the absolute value of the slope dV/dt of voltage with respect to time at that time is very large. If the change with time of the output drain voltage Vds of the cascade transistor becomes very large, along with this change, a current that is proportional to the magnitude of dV/dt flows to the equivalent capacitances Cds and Cgd connected to the output of the cascade transistor.

When for example the drain voltage Vds changes with a large dV/dt, a spike is generated in the drain current Ids from the source-drain capacitance Cds connected between the drain terminal and the source terminal of the cascade transistor to the transistor channel.

Heat is generated inside the channel due to the spike in the drain current Ids and a pure resistance (in this case Ron) that exists in the channel of the transistor. The larger the source-drain capacitance Cds is, the larger the current flowing through the channel during the transition period from the off state to the on state is and the larger the switching loss Ross during this period is.

Referring to FIG. 7B, the drain voltage Vds of the cascade transistor which is in a resonant state when the gate signal is on, substantially reaches the on voltage Vds_ON as a result of the addition of the 2 nF capacitor Cadd. There is no rapid change in the drain voltage Vds and therefore the spike that existed in the drain current Ids when the gate signal of FIG. 7A is turned on is removed. Thus, by making the timing at which the gate is turned on and the period in which the drain voltage Vds is in a valley match, it is possible to suppress a voltage surge (dV/dt) and it is possible to reduce switching loss when the gate signal transitions from off to on to zero.

Thus, when the capacitor Cadd is connected to the node mid, the oscillation frequency of the waveform of the drain voltage Vds is changed. This is because the waveform of the drain voltage Vds oscillates due to resonance between the capacitance seen from the drain terminal and the inductor connected to the drain terminal. Therefore, the capacitance of the capacitor Cadd is determined such that the oscillation of the waveform of the drain voltage Vds immediately before the gate signal is turned on is at its lowermost point.

FIGS. 8A and 8B will be used to explain the effect on the above-described third problem.

A state in which the cascade transistor is mounted on a printed board is to be simulated and therefore a simulation is performed in which an inductance is connected in series with the gate wiring line and the source wiring line of the cascade transistor, as illustrated in FIG. 4A.

FIG. 8A on the left-hand side illustrates simulation waveforms for a case where the capacitance of the capacitor Cadd is 0 nF, that is, SW is in an off state, which is a condition equivalent to the configuration of the related art. FIG. 8B on the right-hand side illustrates simulation waveforms for the case where the capacitance of the capacitor Cadd is 2 nF and SW is in an on state.

In FIG. 8A and FIG. 8B, from the top, a gate voltage Vgs of the cascade transistor, a drain voltage Vds of the cascade transistor, a current Is flowing from the source terminal of the cascade transistor and a drain current Ids of the cascade transistor are illustrated.

Referring to FIG. 8A, an oscillation phenomenon (ringing) is seen in all of the waveforms, whereas, referring to FIG. 8B, the ringing phenomenon has been removed from all of the waveforms other than the gate signal waveform.

If the capacitance of the capacitor Cadd is set to 1 nF immediately before the gate signal of the cascade transistor becomes on, ringing may also be controlled in addition to the valley of the drain voltage Vds being controlled for the effect on problem 2. As a result, switching loss is reduced and stable operation is secured.

Figure 9:
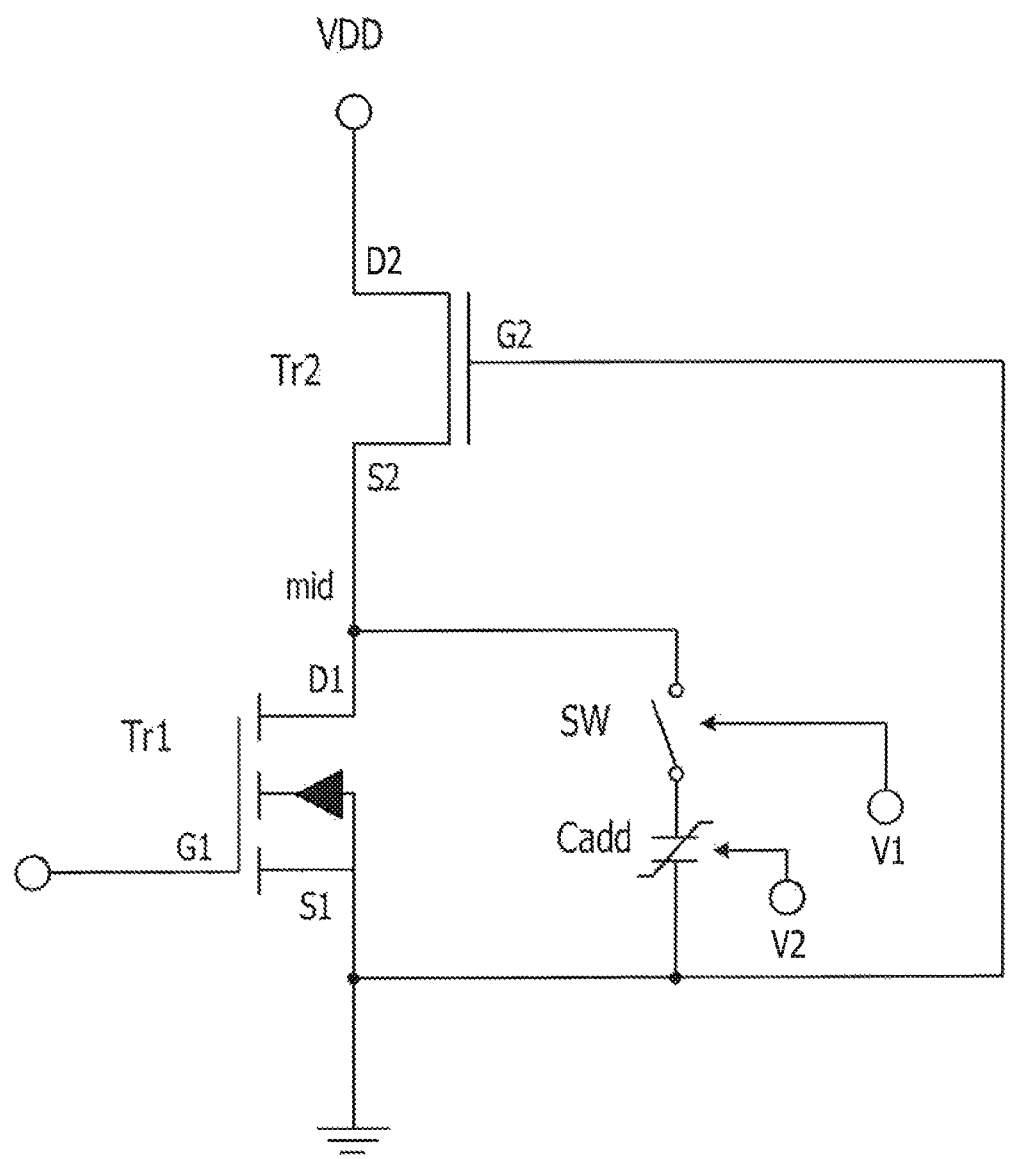
FIG. 9 is a circuit diagram of a cascode transistor of a second embodiment.

FIG. 9 is a diagram illustrating a cascade transistor of a second embodiment in which the disclosed technology is applied. In FIG. 9, constituent elements that are the same as or equivalent to those of the cascade transistor of the first embodiment illustrated in FIG. 5 are denoted by the same symbols and description thereof is omitted.

Regarding the cascade transistor of this embodiment, a circuit, in which a switch SW and a capacitor Caddy are connected in series with each other is connected in parallel between a node mid, at which a source S2 of the second switching element Tr2 and a drain D1 of the first switching element Tr1 are connected to each other, and a source Si of the first switching element Tr1. The switch SW has an external terminal V1 through which switching of the switch may be controlled from the outside. The capacitor CaddV of the cascade transistor of the second embodiment differs from the capacitor Cadd of the cascade transistor of the first embodiment in that it is a voltage variable capacitor and has a control terminal V2 for allowing control of its capacitance. An element whose electrostatic capacitance varies with a voltage applied to a terminal thereof such as a varicap (variable capacitance diode) is used as the voltage variable capacitor.

When the cascade transistor of this embodiment is used, it is possible to simultaneously solve the first problem and the second problem described above.

For example, a spike in the drain current Ids can be removed by setting the capacitance of the capacitor CaddV to for example 1 nF when the gate signal transitions from off to on. Therefore, a current surge (dV/dt) may be controlled and switching loss that occurs when the gate signal transitions from off to on may be reduced to zero.

In addition, the voltage Vmid at the node mid at which the source S2 of the second switching element Tr2 and the drain D1 of the first switching element Tr1 are connected to each other may be reduced so as to be equal to or less than the drain withstand voltage of the first switching element Tr1 and degradation and lifetime reduction of the first switching element Tr1 can be avoided by making the capacitance of the capacitor CaddV be for example from 1 nF to 2 nF when the gate signal transitions from on to off.

Figure 10:
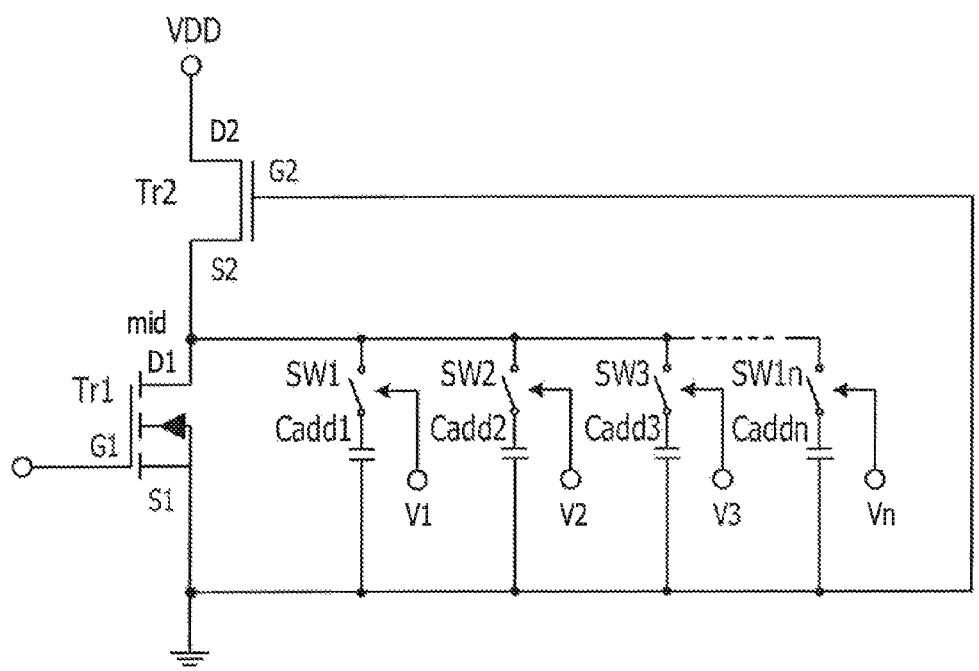
FIG. 10 is a circuit diagram of a cascode transistor of a third embodiment.

FIG. 10 is a diagram illustrating a cascode transistor of a third embodiment in which the disclosed technology is applied. In FIG. 10, constituent elements that are the same as or equivalent to those of the cascode transistor of the first embodiment illustrated in FIG. 5 are denoted by the same symbols and description thereof is omitted.

Regarding the cascode transistor of this embodiment, a plurality of circuits, in which a switch SW and a capacitor Cadd are connected in series with each other, are connected in parallel between a node mid, at which a source S2 of the second switching element Tr2 and a drain D1 of the first switching element Tr1 are connected to each other, and the source Si of the first switching element Tr1. The individual switches SW each have an external terminal through which switching of the switch may be controlled from the outside.

For example, capacitors having different capacitances are arranged such that a capacitor Cadd1, a capacitor Cadd2, a capacitor Cadd3, and a capacitor Cadd4 have capacitances of 0.5 pF, 1 nF, 2 nF and 4 nF, respectively. Then, it is possible to set the capacitance connected to the node mid in units of 0.5 pF by individually turning on or off the switches SW1 to SWn.

It is possible to remove a spike from the drain current Ids by turning on only the switch SW1 to make the capacitance of the capacitor connected to the node mid be for example 0.5 pF when the gate signal transitions from off to on. Therefore, a current surge (dV/dt) may be controlled and switching loss that occurs when the gate signal transitions from off to on may be reduced to zero.

In addition, the voltage Vmid at the node mid at which the source S2 of the second switching element Tr2 and the drain D1 of the first switching element Tr1 are connected to each other may be reduced to be equal to or less than the drain withstand voltage of the first switching element Tr1 and degradation and lifetime reduction of the first switching element Tr1 may be avoided by turning the switch SW1 and the switch SW2 on and making the capacitance of the capacitor be for example from 1.5 nF when the gate signal transitions from on to off.

The capacitance of the capacitor Cadd connected to the node mid is dependent on the waveform of the drain voltage Vds immediately before the gate signal is turned on. This is because the waveform of Vds oscillates due to resonance between a capacitance seen from the drain terminal and a boost inductor connected to the drain terminal, but when the capacitor Cadd is connected, the frequency of the oscillation is changed. The capacitance connected to the node mid is set so that the oscillation of the waveform of Vds immediately before the gate signal is turned on is approaching its lowermost point.

Figure 11:
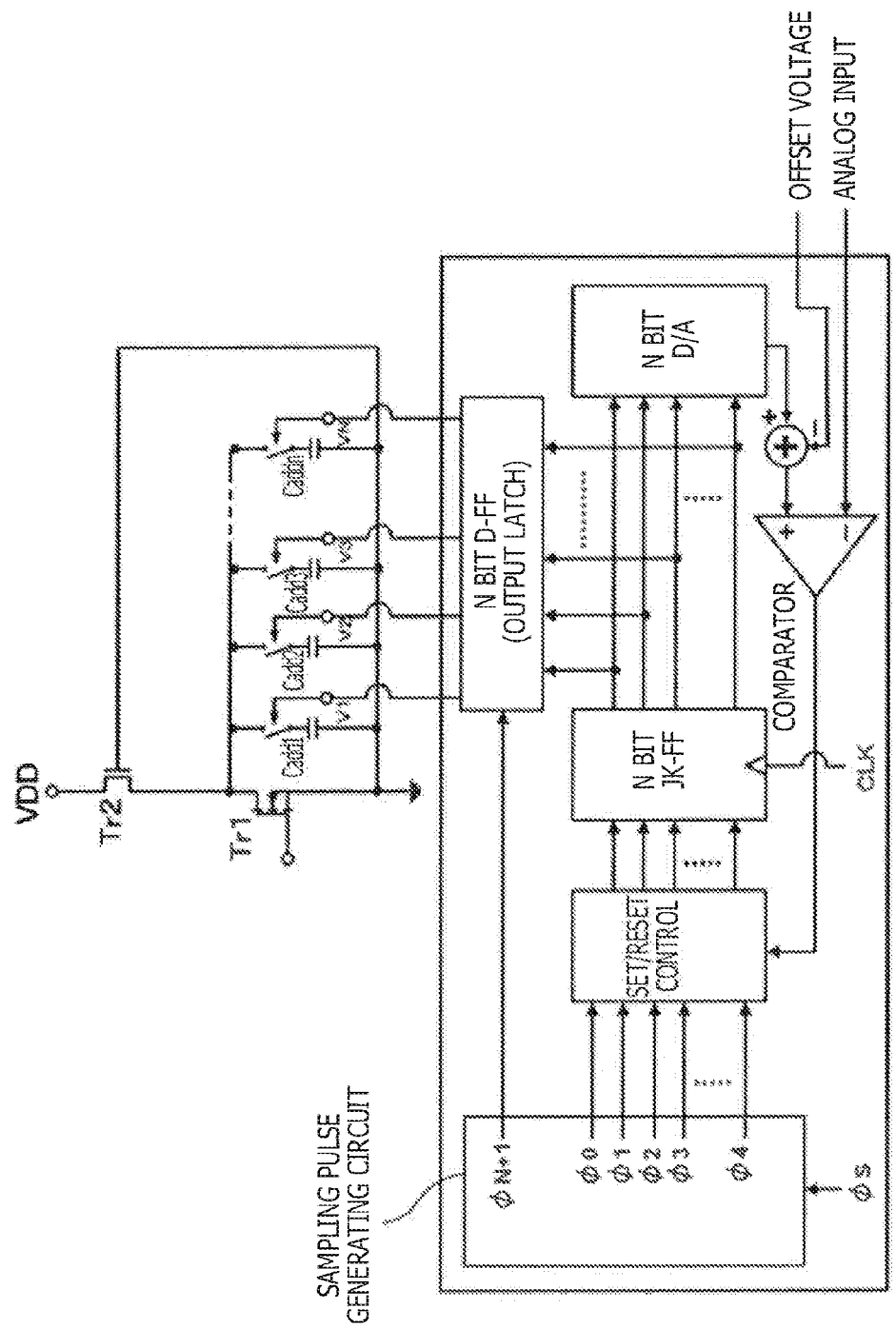
FIG. 11 is a diagram of a control circuit for the cascode transistor of the third embodiment.

FIG. 11 illustrates a concrete example of a control circuit that individually turns the switches SW1 to SWn of the cascode transistor of the third embodiment on and off. The control circuit turns the switches SW1 to SWn on and off in synchronization with the gate signal of the cascode transistor.

As conditions for deciding upon the value of the capacitance connected to the node mid, an output voltage, an output current or an input current of a booster circuit that employs the cascode transistor, or a ringing peak voltage of the gate or drain voltage waveform or a gate signal of the cascode transistor is input as an input offset voltage or an analog input of a converter. The capacitance connected to the node mid of the cascode transistor may be appropriately adjusted by the control circuit to match the operation of for example a booster circuit that employs the cascode transistor. As a result, there is an effect that the reliability of the booster circuit or the like that employs the cascode transistor is improved and switching loss is reduced.

Figure 12:
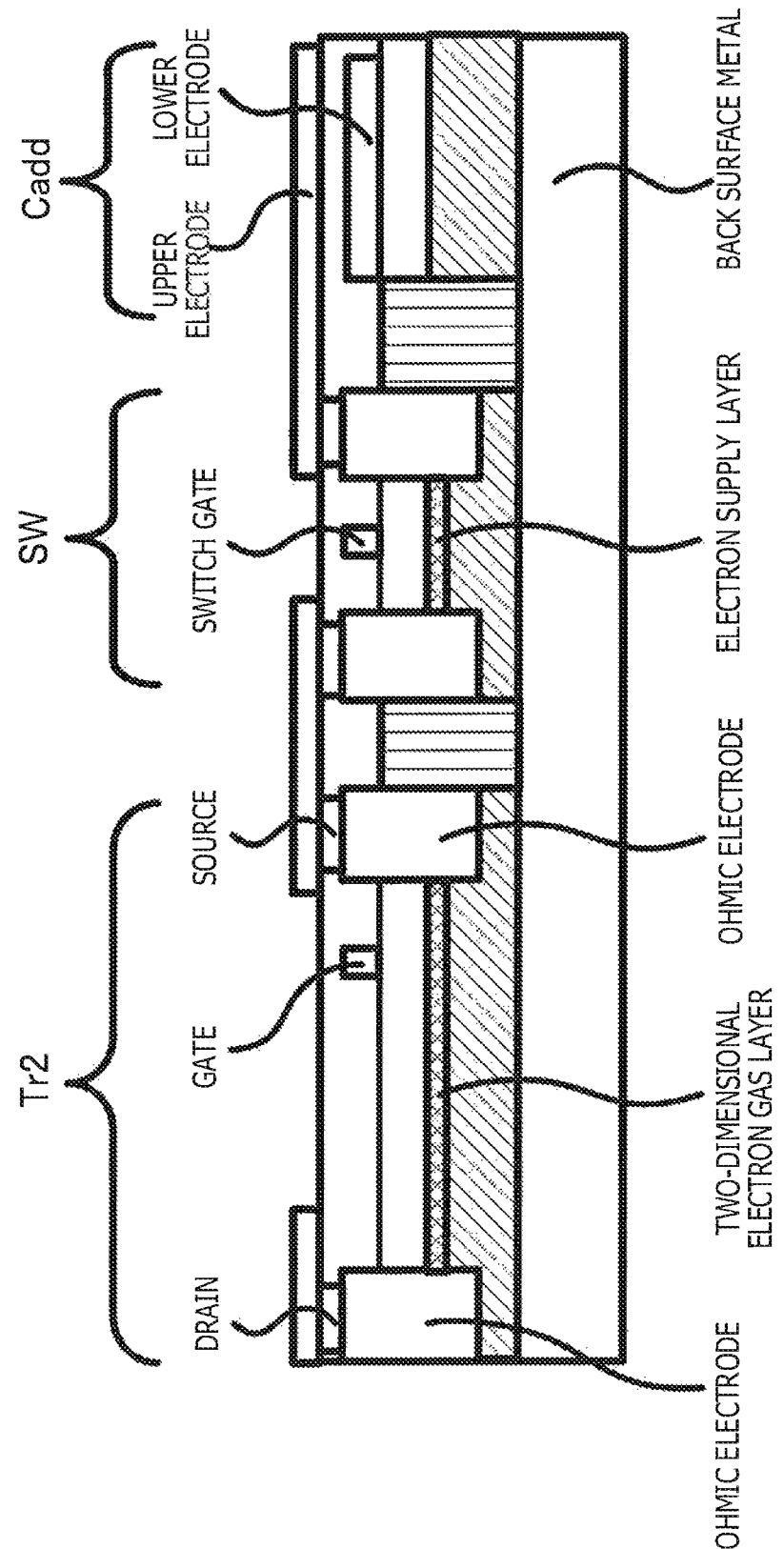
FIG. 12 is a sectional view of a semiconductor chip of the cascode transistor of the first embodiment.

FIG. 12 is a sectional view of a semiconductor chip in which the capacitor Cadd and the switch SW are manufactured in the same processing step as the first switching element Tr1 or the second switching element Tr2. In the example of FIG. 12, the second switching element Tr2, which is a GaN-HEMT, and the capacitor Cadd and the switch SW are formed as a single semiconductor chip.

Figure 13:
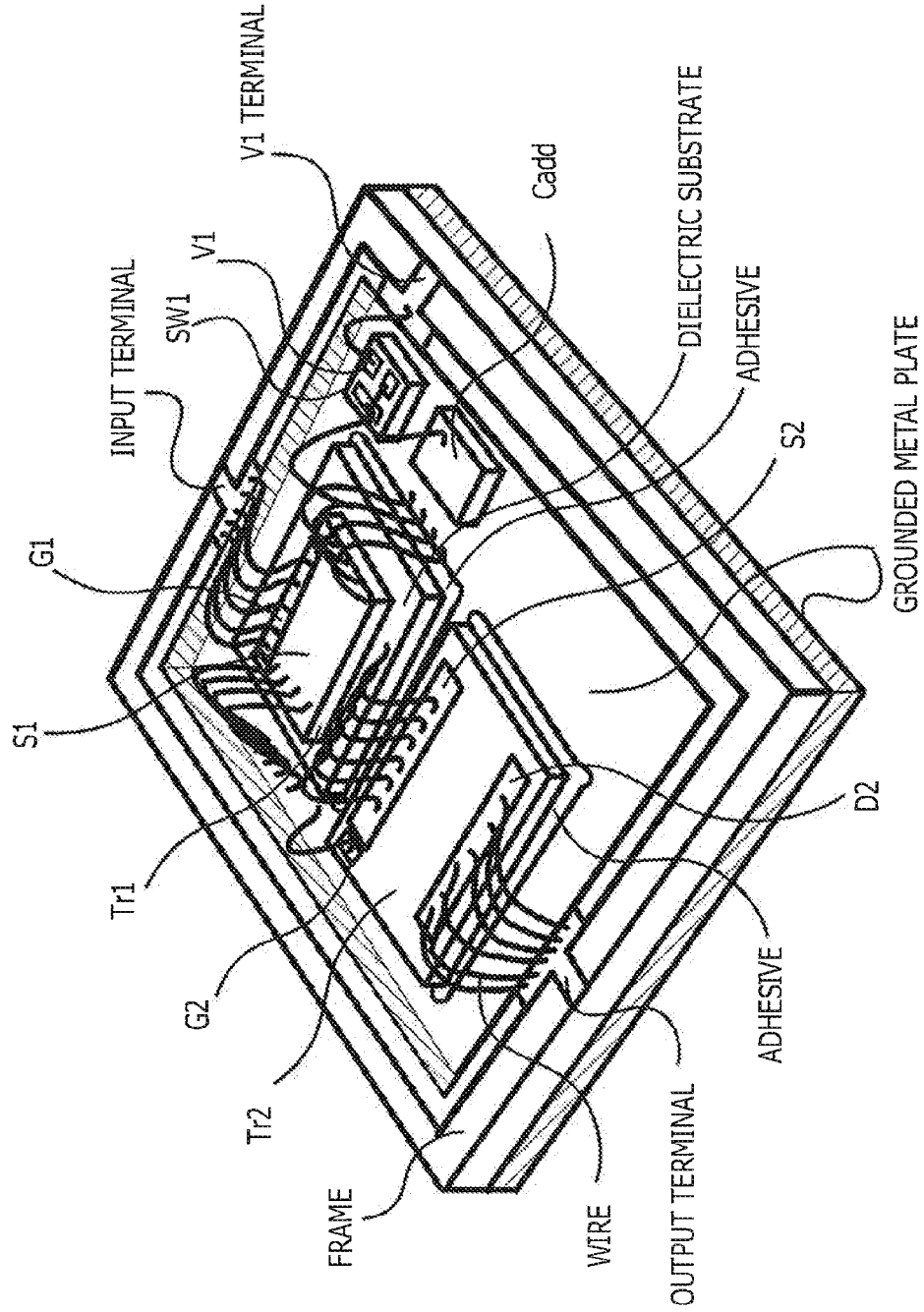
FIG. 13 is a structural diagram of an electronic component that contains the cascode transistor of the first embodiment.

FIG. 13 illustrates an example of the structure of an electronic component in which a device composed of the cascode transistor circuit illustrated in FIG. 5 is housed in a single package.

The second switching element Tr2, the capacitor Cadd, the switch SW and a dielectric substrate are fixed onto a grounded metal plate. The first switching element Tr1 is mounted on the dielectric substrate, and the dielectric substrate is electrically connected to a drain terminal (not illustrated) on a back surface of the first switching element Tr1 and therefore essentially the dielectric substrate serves as the drain terminal D1 of the first switching element Tr1.

An upper surface of the first switching element Tr1 serves as a source terminal S1 and is connected to the grounded metal plate by a plurality of wires.

The source terminal S2 on the upper surface of the second switching element Tr2 and the dielectric substrate are connected to each other by a plurality of wires. The gate terminal G2 on the upper surface of the second switching element Tr2 and the grounded metal plate are connected by a wire.

A lower electrode on the back surface of the capacitor Cadd is electrically connected to the grounded metal plate. An upper electrode on the upper surface of the capacitor Cadd is connected to one terminal on the upper surface of the switch SW by a wire and another terminal on the upper surface of the switch SW and the dielectric substrate serving as the drain electrode D1 of the first switching element Tr1 are connected to each other by a wire.

A frame, on which an input terminal, an output terminal and a V1 terminal for the external terminal V1 for controlling the switch SW are formed, is mounted in a recess of the grounded metal plate. The input terminal of the frame and the gate terminal G1 on the upper surface of the first switching element Tr1 are connected by a plurality of wires. The output terminal of the frame and the drain terminal D2 on the upper surface of the second switching element Tr2 are connected by a plurality of wires. The V1 terminal of the frame and the external terminal V1 on the upper surface of the switch SW are connected to each other with a wire.

In addition, the wires and devices are sealed with a resin for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A cascade transistor comprising:
   a first switch;
   a second switch that has a withstand voltage higher than that of the first switch and is cascade coupled to a drain of the first switch; and
   a circuit in which a third switch and a capacitor are coupled in series with each other and that is provided between a connection node and a source of the first switch, the connection node being a node at which the first switch and the second switch are coupled to each other.

2. The cascade transistor according to claim 1, wherein the third switch has an external connection terminal that allows the third switch to be switched from the outside.

3. The cascade transistor according to claim 2, wherein a signal that turns the third switch on is input to the external connection terminal and the capacitor is electrically coupled to the connection node before a gate signal of the first switch is turned off.

4. The cascade transistor according to claim 2, wherein a signal that turns the third switch off is input to the external connection terminal and the capacitor and the connection node are electrically coupled isolated from each other before a gate signal of the first switch is turned on.

5. The cascade transistor according to claim 1, wherein the capacitor has a capacitance that changes an oscillation period of a drain voltage that oscillates due to a parasitic inductance coupled to a source of the cascade transistor and a gate-source capacitance so that the drain voltage is smallest at a timing at which the gate of the cascade transistor is turned on.

6. The cascode transistor according to claim 1, wherein the capacitor is a voltage variable capacitor and has a control terminal through which its capacitance is changed.

7. The cascode transistor according to claim 1, wherein the circuit, in which the capacitor and the third switch are coupled in series with each other, is provided in a plurality, the circuits being coupled in parallel between the connection node and the source of the first switch.

8. The cascode transistor according to claim 7, further comprising a circuit that controls the circuits in which the capacitor and the third switch are coupled in series with each other.

9. The cascode transistor according to claim 1, wherein the first switch is a normally-off-type MOS-FET and the second switch is a normally-on-type GaN-HEMT.

10. A method of controlling a cascode transistor that includes
    a first switch,
    a second switch that has a higher withstand voltage than the first switch and is cascade coupled to a drain of the first switch, and
    a circuit in which a third switch and a capacitor are coupled in series with each other and that is provided between a connection node and a source of the first switch, the connection node being a node at which the first switch and the second switch are coupled to each other,
    the method comprising:
    electrically coupling the capacitor to the connection node by turning the third switch on before a gate of the first switch is turned off.

11. The method of controlling a cascode transistor according to claim 10, wherein the connection node and the capacitor are electrically isolated from each other by turning the third switch off before the gate of the first switch is turned on.

12. A semiconductor device comprising:
    a first switch that is formed on a semiconductor substrate or a second switch that has a higher withstand voltage than the first switch, is cascode coupled to the first switch and is formed on the semiconductor substrate; and
    a circuit in which a third switch and a capacitor are coupled in series with each other on the semiconductor substrate and that is provided between a connection node, at which the first switch and the second switch are coupled to each other, and a source of the first switch.

* * * * *